United States Patent
Solt

(10) Patent No.: US 8,572,412 B1
(45) Date of Patent: Oct. 29, 2013

(54) METHOD AND APPARATUS FOR WARMING UP INTEGRATED CIRCUITS

(75) Inventor: Yosef Solt, Atzmon-Segev (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 220 days.

(21) Appl. No.: 13/015,139

(22) Filed: Jan. 27, 2011

Related U.S. Application Data

(60) Provisional application No. 61/300,348, filed on Feb. 1, 2010.

(51) Int. Cl.
*G06F 1/00* (2006.01)
(52) U.S. Cl.
USPC ............................................ 713/300; 702/132
(58) Field of Classification Search
USPC ........... 713/300–340; 365/211, 191; 714/733; 702/132
See application file for complete search history.

(56) References Cited

U.S. PATENT DOCUMENTS

| | | | |
|---|---|---|---|
| 7,483,806 B1* | 1/2009 | Arsovski et al. | 702/132 |
| 7,656,734 B2* | 2/2010 | Thorp et al. | 365/211 |
| 7,716,007 B2* | 5/2010 | Arsovski et al. | 702/132 |
| 7,859,918 B1* | 12/2010 | Nguyen et al. | 365/189.09 |
| 8,016,482 B2* | 9/2011 | Arsovski et al. | 374/178 |
| 8,089,180 B2* | 1/2012 | Takahashi et al. | 307/117 |
| 8,358,145 B1* | 1/2013 | Ferris et al. | 324/750.03 |
| 2011/0255353 A1* | 10/2011 | Fukushima et al. | 365/191 |

* cited by examiner

*Primary Examiner* — Tim T Vo
*Assistant Examiner* — Kim Huynh

(57) ABSTRACT

Aspects of the disclosure provide an integrated circuit (IC) chip. The IC chip includes functional circuits configured to perform desired functions when a chip temperature is higher than a threshold, such as a room temperature. The IC chip includes a warm-up module configured to warm-up the IC chip in a warm-up mode to raise the chip temperature above the threshold. A method for warming up an IC chip prior to operation is also disclosed.

17 Claims, 3 Drawing Sheets

METHOD AND APPARATUS FOR WARMING UP INTEGRATED CIRCUITS

INCORPORATION BY REFERENCE

This application claims the benefit of U.S. Provisional Application No. 61/300,348, "Chip Warm-Up Sequence" filed on Feb. 1, 2010, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

During integrated circuit (IC) testing, an IC chip may need to be tested at multiple temperatures to ensure that the IC chip performs correct functions in a temperature range. In an example, a chip is required to operate in an ambient temperature range from −25° C. to 125° C. Then, during IC testing, the chip is tested at a cold temperature, such as −25° C., at a room temperature, such as 25° C., and at a hot temperature, such as 125° C.

SUMMARY

Aspects of the disclosure provide an integrated circuit (IC) chip. The IC chip includes a plurality of functional circuits configured to perform desired functions when a chip temperature is higher than a threshold, such as a room temperature. The IC chip includes a warm-up module configured to warm-up the IC chip in a warm-up mode to raise the chip temperature above the threshold.

In an embodiment, the warm-up module includes a warm-up determination unit configured to determine that the IC chip is warmed up. In an example, the warm-up determination module includes a timing element. In another example, the warm-up determination module includes a temperature-sensing element, such as a thermal-diode, a ring oscillator, a temperature sensing circuit, and the like. A temperature sensing circuit is disclosed in U.S. Pat. No. 7,726,877, which is incorporated herein by reference in its entirety. In an example, the warm-up determination module includes a digital ring oscillator that outputs a digital value as a function of the chip temperature.

According to an aspect of the disclosure, the warm-up module includes a warm-up controller configured to drive the plurality of functional circuits to warm up the IC chip in the warm-up mode.

In an embodiment, the plurality of functional circuits include memory circuits. The warm-up controller is configured to provide inputs to the memory circuits to drive the memory circuits to warm-up the IC chip. In an example, the IC chip includes a memory built-in self-test (BIST) configured to generate memory test patterns to test the memory circuits. The warm-up controller is configured to control the memory BIST to provide memory test patterns to the memory circuits to warm up the IC chip.

In another embodiment, the plurality of functional circuits include logic circuits. The warm-up controller is configured to provide inputs to the logic circuits to drive the logic circuits to warm-up the IC chip. In an example, the logic circuits are scan-test enabled. The IC chip includes a built-in self-test (BIST) configured to generate test patterns to perform scan test of the logic circuits. The warm-up controller is configured to control the BIST to provide the test patterns to the logic circuits to warm-up the IC chip.

In another embodiment, the plurality of functional circuits include a packet processor. The warm-up controller is configured to generate and provide packets to the packet processor for processing, and to drive the packet processor to warm-up the IC chip.

In another embodiment, the warm-up controller is configured to generate a pseudo random bit sequence (PRBS) as inputs to the plurality of functional circuits.

Aspects of the disclosure also provide a method for warming up an integrated circuit (IC) chip. The method includes powering up the plurality of functional circuits on the IC chip in a warm-up mode. The plurality of functional circuits are configured and tested to perform desired functions in a normal operation mode that is related to a chip temperature. Further, the method includes driving at least a portion of the plurality of functional circuits to warm-up the IC chip until the chip temperature exceeds a threshold. Then, the method includes switching the IC chip into the normal operation mode.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
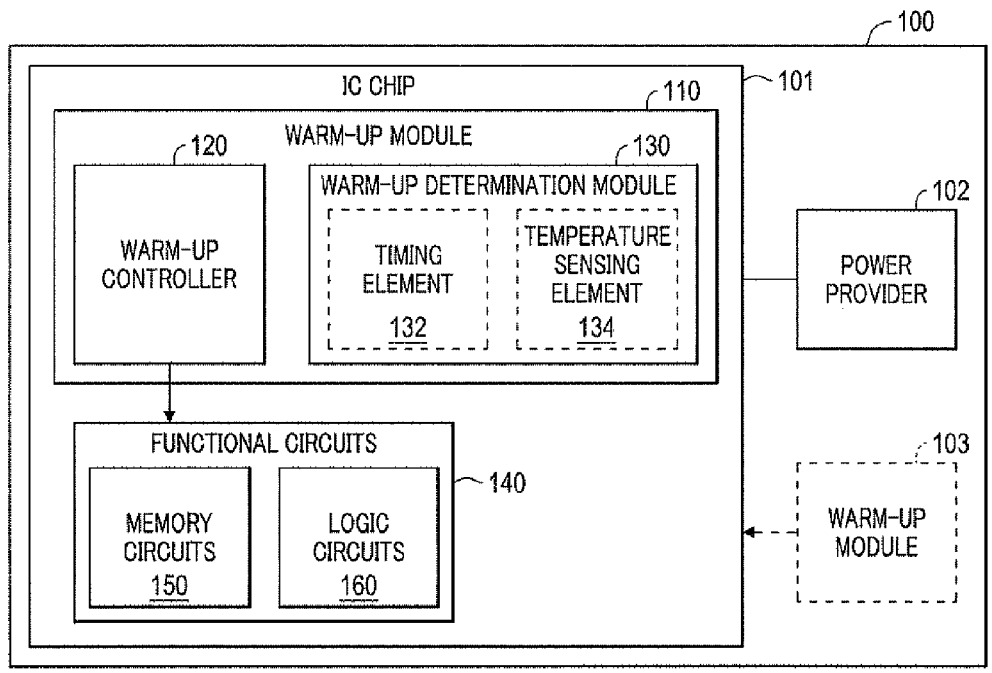
FIG. 1 shows a block diagram of an electronic system 100 according to an embodiment of the disclosure.

FIG. 1 shows a block diagram of an electronic system 100 according to an embodiment of the disclosure. The electronic system 100 includes an integrated circuit (IC) chip 101 and a power provider 102 that provides electrical power to the IC chip 101. The IC chip 101 includes functional circuits 140 that perform desired functions when a chip temperature is in a suitable range, and a warm-up module 110 that causes the IC chip 110 to warm up, such that the chip temperature is in the suitable range.

According to an aspect of the disclosure, the chip temperature changes during operation; typically the chip temperature heats up from use. In an embodiment, the power provider 102 is switchable. Before the power provider 102 is switched on, the IC chip 101 typically has a chip temperature that is about the same as an ambient environment temperature. After the power provider 102 is switched on, when the functional circuits 140 starts to have circuit activities, the chip temperature starts to increase. While the functional circuits 140 continue operating, the chip temperature remains relatively high.

In another embodiment, the IC chip 101 has a power saving mode, such as a sleep mode, and the like. When the IC chip 101 is configured in the sleep mode, a power grid is disabled to power off at least a portion of the functional circuits 140 to reduce circuit activities, and then the chip temperature drops, for example, to about the same as the environment temperature. When the IC chip 101 is awaken, the power grid is enabled to power on the functional circuits 140. The circuit activities of the functional circuits 140 increase the chip temperature.

It is noted that the ambient environment temperature can be relatively low, for example, lower than 25° C. According to an aspect of the disclosure, the IC chip 101 does not undergo testing at a relatively low temperature. For example, in an embodiment, the IC chip 101 is only tested at 25° C. and 125° C. to ensure that the functional circuits 140 properly perform desired functions in the temperature range between 25° C. and 125° C. In an embodiment, a cold test that tests the IC chip 101 at a relatively low temperature, such as −25° C., is skipped, thus saving test time and reducing manufacturing costs.

In an embodiment, when the IC chip 101 is powered up, or awaken from a low power sleep mode, the IC chip 101 enters a warm-up mode. In the warm-up mode, the warm-up module 110 causes the IC chip 101 to warm up to above 25° C., and then the IC chip 101 enters a normal operation mode. Thus, the IC chip 101 can operate correctly in an environment having an ambient temperature below 25° C. In an example, the warm-up module 110 takes a time duration, such as about one second, to raise the chip temperature from −25° C. to 25° C. After the time duration, the chip temperature is above 25° C., and the functional circuits 140 can perform the desired functions.

According to an aspect of the disclosure, the warm-up module 110 uses existing circuits on the IC chip 101 to warm up the IC chip 101. In an embodiment, the warm-up module 110 provides inputs to the functional circuits 140 to perform circuit activities in the functional circuits 140, for the purpose of warming up the IC chip 101. The functional circuits 140 may or may not perform correctly in response to the inputs, while the chip is still cold, but the circuit activities generate heat and causes the IC chip 101 to warm up.

In an embodiment, the warm-up module 110 includes a warm-up controller 120 and a warm-up determination module 130. The warm-up controller 120 is configured to generate inputs and provide the generated inputs to the functional circuits 140. The warm-up controller 120 can use any suitably techniques to generate the inputs. In an example, the warm-up controller 120 is configured to generate a pseudo random bit sequence (PRBS), and suitably uses the PRBS as inputs to the functional circuits 140. In another example, the IC chip 101 includes a built-in self-test (BIST) module (not shown). The warm-up controller 120 is configured to control the BIST module to generate test patterns, and provide test patterns to the functional circuits 140. It is noted that, in an example, the warm-up controller 120 also controls the BIST module to ignore test results during warm-up.

The warm-up determination module 130 is configured to determine whether the IC chip 101 is warmed up. In an example, the warm-up determination module 130 includes a timing element 132, such as a timer, a counter and the like, that determines a warm-up time duration. In another example, the warm-up determination module 130 includes a temperature-sensing element 134, such as a thermal diode, a ring oscillator, a temperature sensing circuit, and the like to sense a chip temperature. A temperature sensing circuit is disclosed in U.S. Pat. No. 7,726,877, which is incorporated herein by reference in its entirety. In an example, the warm-up determination module 130 includes a digital ring oscillator that outputs a digital value as a function of the chip temperature.

In an embodiment, the timing element 132 is configured to set a one-second warm-up time duration. When the power provider 102 starts to provide power to the IC chip 101, the timing element 132 starts timing, and the warm-up controller 120 starts to provide inputs to the functional circuits 140. When the timing element 132 reaches one second, the warm-up controller 120 stops providing inputs to the functional circuits 140.

In another embodiment, the warm-up determination module 130 includes a digital ring oscillator (not shown). The digital ring oscillator outputs a digital frequency that is a function of the chip temperature. Further, the warm-up determination module 130 includes a frequency threshold. In an example, the frequency threshold is determined as a function of chip characteristics of the IC chip 101 after chip testing, and is stored in a one-time programmable memory or an e-fuse on the IC chip 101. The warm-up determination module 130 compares the digital frequency output from the digital ring oscillator with the frequency threshold to determine whether the IC chip 101 is sufficiently warmed up.

It is noted that the warm-up module 110 can use any suitable circuits in the functional circuits 140 to warm up the IC chip 101. In an example, the functional circuits 140 include memory circuits 150 and logic circuits 160. The memory circuits 150 and the logic circuits 160 typically occupy about 90% silicon area on the IC chip 101. The warm-up module 110 suitably uses the memory circuits 150 and the logic circuits 160 to quickly warm up the IC chip 101.

In another example, the functional circuits 140 include a processor (not shown), such as a packet processor, and the like. The warm-up module 110 provides suitable inputs to the packet processor to perform circuit activities. In another example, the functional circuits 140 include analog input/output (I/O) circuits (not shown). The warm-up module 110 provides suitable inputs to the analog I/O circuits to perform circuit activities.

It is noted that, in an embodiment, the electronic system 100 uses an external warm-up module to control the functional circuits 140 to warm up the IC chip 101. For example, the electronic system 100 includes a warm-up module 103 that is external to the IC chip 101. In an example, when the power provider 102 starts to provide power to the IC chip 101, the external warm-up module 103 sends control signals to the IC chip 101 to enable, for example, a BIST module to provide test patterns to the functional circuits 140. Then, in response to the test patterns, the functional circuits 140 perform circuit activities that warm up the IC chip 101. It is noted that, in an example, the external warm-up module 103 controls the BIST module to ignore test results performed before the chip reaches its operating temperature.

In another example, when the power provider 102 starts to provide power to the IC chip 101, the external warm-up module 103 generates inputs and provides the generated inputs to the functional circuits 140 to perform circuit activities in order to warm up the IC chip 101.

Figure 2:
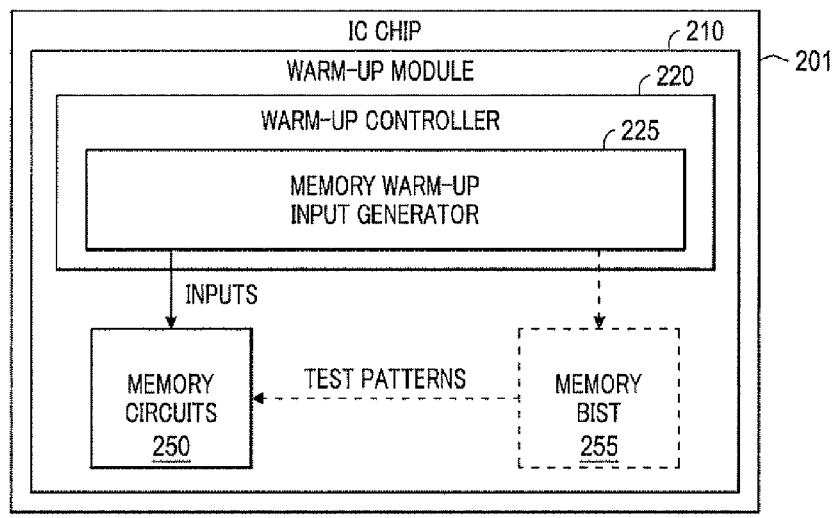
FIG. 2 shows a block diagram of an integrated circuit (IC) chip 201 according to an embodiment of the disclosure.

FIG. 2 shows a block diagram of an IC chip 201 according to an embodiment of the disclosure. The IC chip 201 includes memory circuits 250 and a warm-up module 210 that uses the memory circuits 250 to warm up the IC chip 201.

The memory circuits 250 include any suitable memory, such as static random access memory (SRAM), dynamic random access memory (DRAM), electrically programmable read only memory (EPROM), electrically erasable programmable read-only memory (EEPROM), flash memory, content addressable memory (CAM), ternary content addressable memory (TCAM), and the like. In addition, the memory circuits 250 include suitable peripheral circuits, such as decoder circuits, sense-amplifier circuits, encoder circuits, and the like.

The warm-up module 210 includes a warm-up controller 220 that is configured to provide suitable inputs to the memory circuits 250 to perform memory activities in the memory circuits 250. In an example, the memory circuits 250 include SRAM (not shown). The warm-up controller 220 provides inputs to the SRAM to write to the SRAM and/or read from the SRAM.

In an embodiment, the warm-up controller 220 includes a memory warm-up input generator 225 to generate inputs, and then the warm-up controller 220 provides the generated inputs to the memory circuits 250 to perform memory activities.

In another embodiment, the IC chip 201 includes a memory BIST 255 for testing the memory circuits 250. Specifically, the memory BIST 255 is configured to generate test patterns for memory test, provide the generated test patterns to the memory circuits 250, receive outputs from the memory circuits 250, and detect errors from the outputs.

The warm-up controller 220 suitably controls the memory BIST 255 to repetitively test the memory circuits 250 until the IC chip 201 is suitably warmed up. In an example, the warm-up controller 220 controls the memory BIST 255 to ignore errors, and repetitively test the memory circuits 250 until a temperature-sensing element (not shown) senses that the chip temperature is above a threshold. For example, the memory BIST 255 includes a comparator that compares the outputs with expected outputs to detect errors. The warm-up controller 220 disables the comparator to ignore the outputs from the memory circuits 250.

In another example, the warm-up controller 220 does not disable the error detection of the BIST 255. The warm-up controller 220 controls the memory BIST 255 to repetitively test the memory circuits 250 until no error is detected.

Figure 3:
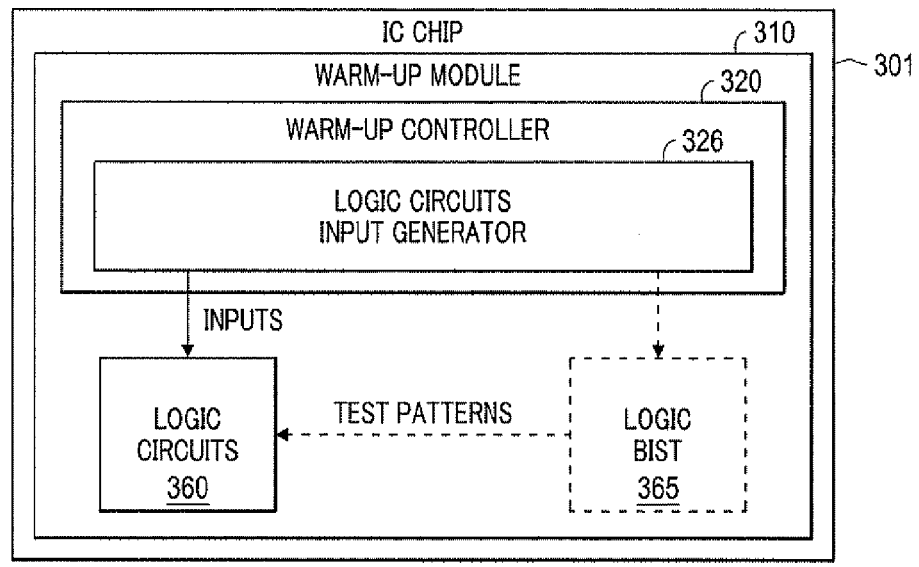
FIG. 3 shows a block diagram of an IC chip 301 according to an embodiment of the disclosure.

FIG. 3 shows a block diagram of an IC chip 301 according to an embodiment of the disclosure. The IC chip 301 includes logic circuits 360 and a warm-up module 310 that uses the logic circuits 360 to warm up the IC chip 301.

The logic circuits 360 include any suitable logic circuits, such as combinational circuits, sequential circuits, digital logic circuits, analog logic circuits, and the like. The warm-up module 310 includes a warm-up controller 320 that is configured to provide suitable inputs to the logic circuits 360 to perform circuit activities in the logic circuits 360.

In an embodiment, the warm-up controller 320 includes a logic circuits warm-up input generator 326 to generate suitable inputs. Then, the warm-up controller 320 provides the generated inputs to the logic circuits 360 to perform circuit activities.

It is noted that the logic circuits warm-up input generator 326 can use any suitable technique to generate the inputs. In an example, the logic circuits warm-up input generator 326 includes a read-only memory (ROM) (not shown) that stores a test-pattern set that is pre-generated according to automatic test pattern generation (ATPG), and pre-stored in the ROM. The warm-up controller 320 repetitively reads the test pattern set from the ROM and provides the test pattern set to the logic circuits 360 until the IC chip 301 is warmed up.

In another example, the logic circuits warm-up input generator 326 includes a pseudo random bit sequence (PRBS) generator (not shown) configured to generate a pseudo random bit sequence. Then, the warm-up controller 320 provides the pseudo random bit sequence to the logic circuits 360 to perform circuit activities.

In another embodiment, the logic circuits 360 are scan-test enabled. The logic circuits 360 include scan chains to provide control and observability to the logic circuits 360. Further, the IC chip 301 includes an existing logic BIST 365 that is configured to test the logic circuits 360 via the scan chains. The logic BIST 365 is configured to generate test patterns, provide test patterns to the scan chains to perform scan test of the logic circuits 360, receive outputs from the logic circuits 360 via the scan chains, and detect errors from the outputs.

In an example, the warm-up controller 320 controls the logic BIST 365 to repetitively test the logic circuits 360, and ignore errors until a temperature sensing element (not shown) senses that the chip has reached a suitable operating temperature that is, for example, above a threshold temperature. For example, the warm-up controller 320 disables a comparator in the logic BIST 365 that compares the outputs with expected outputs to detect errors.

In another example, the warm-up controller 320 does not disable the error detection of the logic BIST 365. The warm-up controller 320 controls the logic BIST 365 to repetitively test the logic circuits 360 until no error is detected.

Figure 4:
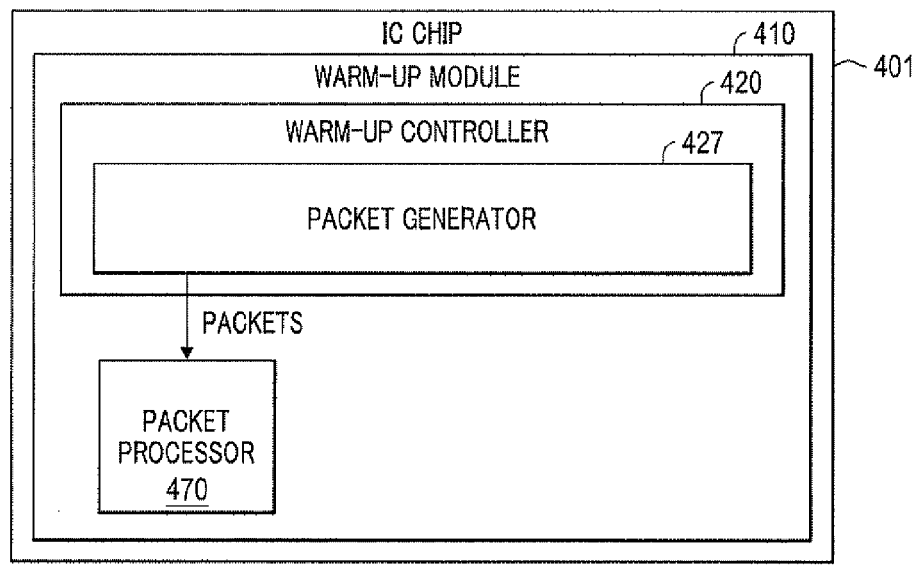
FIG. 4 shows a block diagram of an IC chip 401 according to an embodiment of the disclosure.

FIG. 4 shows a block diagram of an IC chip 401 according to an embodiment of the disclosure. The IC chip 401 includes a packet processor 470 and a warm-up module 410. The packet processor 470 is configured to process and route packets. The warm-up module 410 provides inputs to the packet processor 470 to use the packet processor 470 to warm up the IC chip 401.

The packet processor 470 can be implemented solely by hardware, or can be implemented as a combination of hardware and software. The warm-up module 410 includes a warm-up controller 420 configured to provide suitable packets to the packet processor 470 to perform circuit activities in the packet processor 470. For example, the warm-up controller 420 includes a packet generator 427 that generates dummy packets. The warm-up controller 420 repetitively provides the dummy packets to the packet processor 470 to perform circuit activities in the packet processor 470 until the IC chip 401 is warmed up.

Figure 5:
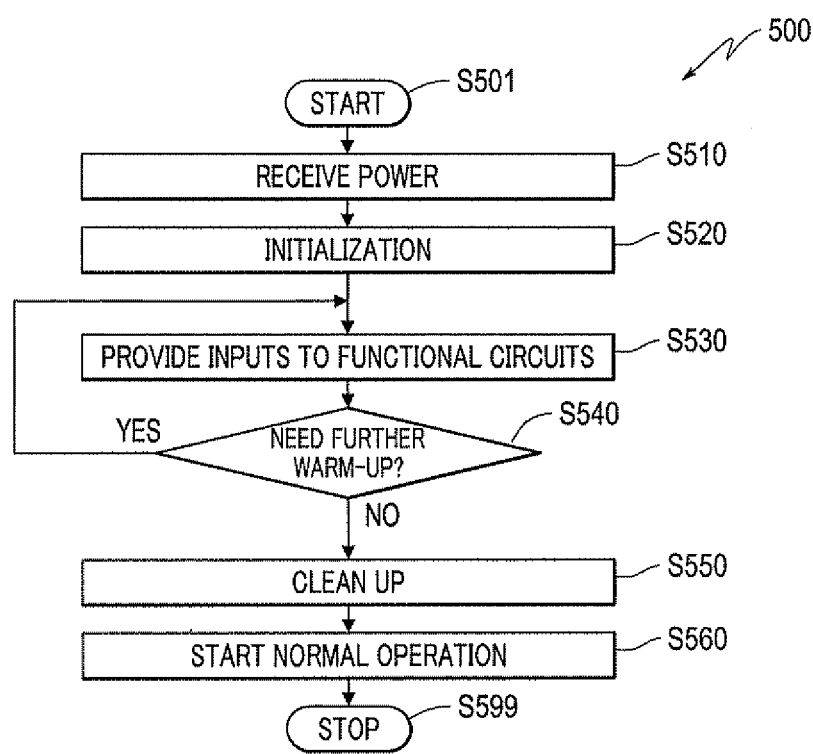
FIG. 5 shows a flow chart outlining a process example 500 for warming up an IC chip according to an embodiment of the disclosure.

FIG. 5 shows a flow chart outlining a process example 500 for warming up an IC chip, such as the IC chip 101, according to an embodiment of the disclosure. The process starts at S501, and proceeds to S510.

At S510, the IC chip 101 receives electrical power. In an example, the power provider 102 is switched on to provide electrical power to the IC chip 101. In another example, the IC chip 101 includes a power grid that can be disabled to stop providing electrical power to a portion of the functional circuits 140 when the IC chip 101 enters a sleep mode. When the IC chip 101 wakes up, the power grid is enabled to direct power to a portion of the functional circuits 140.

At S520, the IC chip 101 performs initialization to enter a pre-known state. In an example, the IC chip 101 is suitably initialized to enter a warm-up mode.

At S530, in the warm-up mode, the warm-up controller 120 provides inputs to the functional circuits 140. In an embodiment, the warm-up controller 120 includes a read-only memory storing pre-generated inputs. The warm-up controller 120 provides the pre-generated inputs to the functional circuits 140. In another embodiment, the warm-up controller 120 includes a pseudo random bit sequence generator configured to generate a pseudo random bit sequence. The warm-up controller 120 provides the generated pseudo random bit sequence to the functional circuits 140. In another embodiment, the IC chip 101 includes a BIST module, such as logic BIST module, memory BIST module, and the like, that generates test patterns to test the functional circuits 140. The warm-up controller 120 controls the GIST module to provide test patterns to the functional circuits 140. It is noted that, in the warm-up mode, while the chip temperature remains below a specified operational temperature, the functional circuits 140 may or may not operate correctly. However, the circuit activities of the functional circuits 140 in response to the inputs generate heat and warm up the IC chip 101.

At S540, the warm-up determination module 130 determines whether the IC chip 101 needs further warm-up. In an embodiment, the warm-up determination module 130 includes the timing element 132. The warm-up determination module 130 determines whether the timing element 132 reaches a pre-set timing duration. In another embodiment, the warm-up determination module 130 includes the temperature-sensing element 134. The warm-up determination module 130 determines whether a chip temperature sensed by the temperature-sensing element 134 exceeds a threshold temperature. In another embodiment, the warm-up determination module 130 determines whether the BIST module detects any errors. When the IC chip 101 needs further warm-up, the process returns to S530; otherwise, the process proceeds to S550.

At S550, the IC chip 101 performs clean up to enter a pre-known state to prepare for normal operation. In an example, the IC chip 101 resets contents in memory cells of the memory circuits 150. Further, the IC chip 101 resets the logic circuits 160 to a suitable state. Then, in an example, the IC chip 101 suitably switches into a normal operation mode.

At S560, the IC chip 101 starts normal operation. Then the process proceeds to S599 and terminates.

It is noted that the process 500 can be suitably modified. In an example, at S530, the external warm-up module 103 activates a BIST module on the IC chip 101 to perform built-in self-test on the functional circuits 140; and at S540, the external warm-up module 103 determines whether the IC chip 101 needs further warm-up based on errors detected by the BIST module.

While the invention has been described in conjunction with the specific embodiments thereof that are proposed as examples, it is evident that many alternatives, modifications, and variations will be apparent to those skilled in the art. Accordingly, embodiments of the invention as set forth herein are intended to be illustrative, not limiting. There are changes that may be made without departing from the scope of the invention.

What is claimed is:

1. An integrated circuit (IC) chip, comprising:
a plurality of functional circuits configured to perform desired functions when a chip temperature is higher than a threshold;
a warm-up module configured to warm-up the IC chip during a warm-up mode to raise the chip temperature above the threshold, a warming energy being supplied during the warm-up mode at least by performing an operation using a functional circuit, among the plurality of functional circuits, having another function that is not a warming function; and
a warm-up controller configured to generate a pseudo random bit sequence (PRBS) as inputs to the plurality of functional circuits and drive the plurality of functional circuits to warm up the IC chip.

2. The IC chip of claim 1, wherein the warm-up module further comprises:
a warm-up determination unit configured to determine that the IC chip is warmed up.

3. The IC chip of claim 2, wherein the warm-up determination unit comprises at least one of a timing element and a temperature-sensing element.

4. The IC chip of claim 2, wherein the warm-up determination unit comprises at least one of a temperature sensing circuit, a thermal-diode and a ring oscillator for sensing the chip temperature.

5. The IC chip of claim 1, wherein:
the plurality of functional circuits comprise memory circuits; and
the warm-up controller is configured to provide inputs to the memory circuits to drive the memory circuits to warm-up the IC chip.

6. The IC chip of claim 5, wherein:
a memory built-in self-test (BIST) configured to generate memory test patterns to test the memory circuits; and
the warm-up controller is configured to control the memory BIST to provide memory test patterns to the memory circuits to warm up the IC chip.

7. The IC chip of claim 1, wherein:
the plurality of functional circuits comprise logic circuits; and
the warm-up controller is configured to provide inputs to the logic circuits to drive the logic circuits to warm-up the IC chip.

8. The IC chip of claim 7, wherein:
the logic circuits are scan-test enabled;
a built-in self-test (BIST) configured to generate test patterns to perform scan-test of the logic circuits; and
the warm-up controller is configured to control the BIST to provide the test patterns to the logic circuits to warm-up the IC chip.

9. The IC chip of claim 1, wherein:
the plurality of functional circuits comprise a packet processor; and
the warm-up controller is configured to generate and provide packets to the packet processor for processing, and to use the packet processor to warm-up the IC chip.

10. A method for warming up integrated circuits, comprising:
powering up a plurality of functional circuits on an integrated circuit (IC) chip in a warm-up mode, a warming energy supplied during the warm-up mode being supplied by performing an operation using a functional circuit of the plurality of functional circuits having another function that is not a warming function, the plurality of functional circuits being configured to perform desired functions in a normal operation mode related to a chip temperature;
driving at least a portion of the plurality of functional circuits to warm-up the IC chip until the chip temperature exceeds a threshold;
switching the IC chip into the normal operation mode;
generating pseudo random bit sequence (PRBS); and
providing the pseudo random bit sequence as inputs to the plurality of functional circuits.

11. The method of claim 10, further comprising:
determining that the IC chip is warmed up based on a timing element.

12. The method of claim 10, further comprising at least one of:
determining that the IC chip is warmed up using a temperature sensing circuit;
determining that the IC chip is warmed up based on a thermal diode; and
determining that the IC chip is warmed up based on monitoring a frequency of a ring oscillator.

13. The method of claim 10, further comprising:
providing inputs to memory circuits to perform memory activities that warm up the IC chip.

14. The method of claim 13, further comprising:
controlling a memory built-in self-test (BIST) to generate memory test patterns, and to provide the test patterns to the memory circuits to perform the memory activities.

15. The method of claim 10, further comprising:
providing inputs to logic circuits to perform logic circuits activities that warm up the IC chip.

16. The method of 15, further comprising:
controlling a built-in self-test (BIST) to generate test patterns to test the logic circuits.

17. The method of claim 10, further comprising:
generating packets; and
providing the generated packets to a packet processor on the IC to perform packet processing activities that warm-up the IC.

* * * * *